United States Patent
Steigerwald

(10) Patent No.: US 6,828,565 B2
(45) Date of Patent: Dec. 7, 2004

(54) ELECTRON BEAM SOURCE, ELECTRON OPTICAL APPARATUS USING SUCH BEAM SOURCE AND METHOD OF OPERATING AND ELECTRON BEAM SOURCE

(75) Inventor: Michael Steigerwald, Aalen (DE)

(73) Assignee: LEO Elektronenmikroskopie GmbH (DE)

( * ) Notice: Subject to any disclaimer, the term of this patent is extended or adjusted under 35 U.S.C. 154(b) by 0 days.

(21) Appl. No.: 10/670,556

(22) Filed: Sep. 26, 2003

(65) Prior Publication Data

US 2004/0124365 A1 Jul. 1, 2004

(30) Foreign Application Priority Data

Sep. 26, 2002 (DE) .......................... 102 45 052

(51) Int. Cl.$^7$ ................................ H01J 27/00
(52) U.S. Cl. .................... 250/423 P; 250/310
(58) Field of Search .................. 250/423 P, 310

(56) References Cited

U.S. PATENT DOCUMENTS

| | | |
|---|---|---|
| 3,864,572 A | 2/1975 | Van de Mast et al. |
| 3,909,663 A * | 9/1975 | Thomas et al. ............. 315/106 |
| 4,096,386 A | 6/1978 | Rempfer et al. |
| 4,151,014 A | 4/1979 | Charschan et al. |
| 4,460,831 A | 7/1984 | Oettinger et al. |
| 4,703,228 A | 10/1987 | West |
| 4,868,380 A | 9/1989 | Booman et al. |
| 5,039,862 A | 8/1991 | Smith et al. |
| 5,041,724 A | 8/1991 | Feuerbaum et al. |
| 5,763,880 A | 6/1998 | Nisiyama et al. |
| 5,808,309 A | 9/1998 | Spehr et al. |
| 5,808,425 A | 9/1998 | Härle |
| 6,376,985 B2 | 4/2002 | Lee et al. |
| 6,444,980 B1 | 9/2002 | Kawato et al. |

FOREIGN PATENT DOCUMENTS

| | | |
|---|---|---|
| DE | 1 005 202 | 9/1957 |
| DE | 23 49 352 B2 | 4/1974 |
| DE | 23 25 786 C2 | 12/1974 |
| DE | 196 04 272 A1 | 8/1996 |
| GB | 1 440 776 | 6/1976 |

OTHER PUBLICATIONS

L. Reimer, "Scanning Electron Microscopy: Physics of Image Formation and Microanalysis," Springer Series in Optical Sciences, pp. 13–19, (1998).

* cited by examiner

Primary Examiner—Nikita Wells
Assistant Examiner—James J. Leybourne
(74) Attorney, Agent, or Firm—Burns, Doane, Swecker & Mathis, LLP

(57) ABSTRACT

An electron beam source comprises a source surface illuminated with a photon beam of adjustable intensity. The photon beam assists emission of electrons from the source surface due to a photo effect. An electric extraction field further assists in electron emission. Further, a heater is provided for further assisting in electron emission by a thermionic effect. An electron beam current is measured, and the intensity of the photon beam is adjusted based on the measured electron beam current.

21 Claims, 2 Drawing Sheets

ELECTRON BEAM SOURCE, ELECTRON OPTICAL APPARATUS USING SUCH BEAM SOURCE AND METHOD OF OPERATING AND ELECTRON BEAM SOURCE

This application claims priority under 35 U.S.C. §§ 119 and/or 365 to DE 102 45 052.8, filed on Sep. 26, 2002, the entire contents of which is hereby incorporated reference.

BACKGROUND OF THE INVENTION

1. Field of the Invention

The invention relates to an electron beam source, a method of operating an electron beam source and an electron optical apparatus using such beam source.

An electron optical apparatus, such as an electron microscope and an electron lithography apparatus using electrons for imaging purposes, comprises at least one electron beam source for providing an electron beam which is used in the apparatus for electron optical imaging or other purposes.

2. Description of the Related Art

Typical demands which an electron beam source should fulfill are the provision of an electron beam having properties such as a high beam current, a high brightness, an intensity which is sufficiently constant over time, and a low width of a distribution of kinetic energies of the electrons in the beam. The width of such distribution is often referred to as FWHM (full width at half maximum). Often it is desirable to operate the electron beam source under conditions which do not permit obtaining a particularly high vacuum.

The conventional electron beam source comprises a cathode body having a source surface from which the electrons emanate, and an anode disposed at a distance from the source surface for providing an electrical extraction field for supporting the emission of electrons from the source surface. A heater may be provided for heating the source surface to further assist the emission process of the electrons from the surface.

Depending on a strength of the extraction field and the temperature of the source surface, plural physical processes may be identified which cause emission of the electrons from the source surface. These processes are illustrated in e.g. Reimer, Scanning Electron Microscopy:Physics of Image Formation and Microanalysis $2^{nd}$ edition, Springer series in optical sciences, 1998). To leave the source surface the electron has to traverse a potential barrier at the metal-vacuum interface, which potential barrier is referred to as work function $\phi_w$ or as chemical potential $\mu_e$.

In a thermionic emission process, the temperature of the source surface is high enough such that the electrons from the Fermi level $E_F$ of the cathode material can overcome the potential barrier by thermionic excitation. For example, thermionic emission is achieved at temperatures of the cathode material above 2500 K to 3000 K using a cathode made of tungsten.

At the low temperatures such that thermionic excitation does not substantially contribute to electron emission and at high electrical excitation fields, a field emission process is the dominating process in electron emission from the surface. Electron sources operating in such regime are referred to as field emission sources. Field emission from a tungsten tip having a radius of about 0.1 $\mu$m starts when the electrical field strength at the surface is $10^7$ V/cm or higher. Such high fields decrease the width of the potential barrier in front of the source surface to a few nanometers so that electrons from the Fermi level $E_F$ can penetrate the potential barrier by a wave mechanical tunneling effect.

The conventional electron beam source further comprises a Schottky emission gun in which the potential barrier or the work function $\phi_w$ is decreased by the Schottky effect. The electrical extraction field in the Schottky emission source is about ten times lower, as compared to the field emission gun, such that a sufficient narrowing of the potential barrier allowing a substantial contribution of the wave mechanical tunneling effect to the total emission does not occur. The Schottky emission source is heated to a temperature which is substantially lower than the operating temperature of a corresponding thermionic emission source. However, the temperature is sufficiently high that the electrons may overcome the remaining potential barrier which is reduced by the Schottky effect.

In view of a low energy width (FWHM) of the electron source, the source surface should be at a low temperature to avoid a thermal broadening of the energy width. From this point of view the field emission source is preferred since this type of source may be operated at room temperature. As a drawback, the field emission source requires operation at ultra high vacuum conditions for preventing destruction of the source surface by ion bombardment. The field emission source is also insufficient with respect to a maximum beam current.

Schottky emission sources are often used as a compromise between low temperatures of the source surface in view of a low energy width, and avoiding making high demands in terms of vacuum conditions. A drawback of the Schottky emission source is a reduced stability of the beam current. Small changes in operating conditions, such as changes of temperature and surface contamination, already result in comparatively high changes of the beam current.

The conventional electron beam source further comprises a photo emission source as illustrated in e.g. U.S. Pat. Nos. 4,460,831 and 5,808,309. In the photo emission source, the source surface is illuminated with a photon beam for releasing electrons from the source surface by a photo effect. The photo emission source is used in applications where the electron beam has to be rapidly switched on and off. Rapidly switchable light sources are readily available, and the electron beam intensity immediately follows in time with the switched photon intensity. However, the photo effect requires using radiation of a particularly short wavelength in photo emission sources using source surfaces made of typical materials employed as electron sources. The energy of the photons incident on the source surface must be higher than the potential barrier or the work function $\phi_w$. Light sources of sufficiently short wavelength are expensive and complicated to operate.

From U.S. Pat. No. 5,041,724 there is known a rapidly switchable photo emission source in which the photon energy necessary for generating photo emission is reduced by reducing the height of the potential barrier by applying an additional strong electrical extraction field, resulting in field assisted photo emission, or by heating the source surface, resulting in thermally assisted photo emission.

Further, U.S. Pat. No. 5,763,880 discloses reducing the potential barrier or work function $\phi_W$ of a cathode body by applying an oxide or nitride layer to the source surface.

SUMMARY OF THE INVENTION

As illustrated above, electron sources having a reduced operating temperature lack adjustability of the beam intensity due to an increased contribution of the wave mechanical tunneling effect.

Accordingly, it is an object of the present invention to provide an electron beam source operated at a reduced temperature of the source surface while allowing for an improved adjustability of a desired beam intensity.

Further, it is an object of the present invention to provide an electron optical apparatus, in particular an electron microscope, generating an electron beam having a reduced energy width and an improved adjustability of the beam current.

It is a further object of the present invention to provide a corresponding method of operating an electron source.

The invention provides an electron beam source for generating a beam of electrons wherein an intensity of a photon beam incident on a source surface for emission of electrons is adjusted dependant on an intensity of the generated electron beam, and wherein heating of the source surface by some process different from the illumination with the photon beam assists in releasing electrons from the source surface.

According to an embodiment, the electron beam source comprises a cathode body having a source surface for emitting electrons, and an anode disposed at a distance from the cathode for generating an electrical extraction field. The extraction field is provided to assist the electrons in overcoming the potential barrier, i.e. to decrease the potential barrier at least by some amount as illustrated above with respect to the Schottky emission source, and by reducing a width of the potential barrier by at least some amount such that the wave mechanical tunneling effect may provide at least some contribution to the electron emission, as illustrated above with respect to the field emission process.

The electron beam source further comprises a photon source for generating at least one photon beam directed to the source surface for assisting in the electron emission, as illustrated above with respect to the photo effect. Thus, at least the extraction field and the photon beam contribute together to release electrons from the source surface.

In view of a reduced intensity of the photon beam, and a reduced energy of the photons or increased wavelength of the light of the photon beam, a heater is provided for heating the cathode body such that thermionic excitation of the electrons also contributes to the emission thereof from the source surface.

Therein it is possible to operate the electron beam source at operating conditions close to that of the Schottky emission type source, such that the thermionic excitation process substantially contributes to the electron emission process. The electron beam source generates a substantial electron beam different from a dark current also in a situation in which the photon beam is not directed to the source surface. A large amount of the energy necessary for emitting the electrons may then be provided by the heater which is of a simple configuration, as compared to the photon source. The photon source may than be used mainly to adjust the intensity of the electron beam, and in particular to maintain the intensity of the electron beam at a constant level.

Even when an energy deposition of the photons in the cathode body may result in heating the source surface above room temperature, such that the heating of the cathode body due to the photon beam also generates some thermal contribution to the emission process; such contribution is low compared to the contribution of the heater. A maximum intensity of the photon beam in a normal mode of operation of the electron source is advantageously limited, such that the source surface, starting from room temperature, will not reach a temperature above 1700 K, or above 1200 K or advantageously not above 700 K, if only the photon beam is incident on the source surface, and no other type of energy, such as by an additional heater, would be actively supplied to the cathode body.

Even though the photon beam provides a relatively low contribution to heating the cathode body, the photon beam provides an important means of adjusting the intensity of the emitted photon beam, since the intensity of the electron beam is adjusted by changing the intensity of the photon beam. For this purpose, the electron beam source further comprises a detector for detecting a beam current of the electron beam and for generating a measuring signal representative of the beam current. The electron beam source further comprises a controller responsive to the measuring signal and configured for controlling the photon source in the normal mode of operation of the electron beam source to change the intensity of the photon beam based on the measuring signal.

Hereby the property of the electron beam source which is to be adjusted, i.e. the intensity of the electron beam, is used as the measured quantity for adjusting the photon beam as the regulated quantity, for finally controlling the electron beam intensity as desired. According to a preferred embodiment the controller may be configured for maintaining the electron beam intensity at a constant level. Alternatively, the controller may be configured to control the electron beam intensity in view of a desired integral beam current, i.e. a total amount of charge emitted by the electron beam source. It is then possible to compensate drifts and changes in the electron beam source which might arise if the intensity of the photon beam is not controlled dependant on the electron beam intensity. Such drifts and changes may result from small changes in temperature of the source surface or from contamination of the source surface. Such changes have a particularly high effect in situations where the temperature of the source surface is low in the normal mode of operation.

According to a further embodiment, the material from which the source surface is made, the electrical extraction field, the heating of the cathode body, and the intensity of the photon beam, are adjusted relative to each other in the normal mode of operation of the electron beam source, such that in a situation where the photon beam is not directed to the source surface the beam current is more than about 30%, in particular more than about 65%, and advantageously more than about 80% of the beam current in the normal mode of operation of the electron beam source in which the photon beam is directed to the source surface.

According to a further embodiment the heater comprises an electric heater such that an Ohmic resistance generates the heat for heating the cathode body.

According to a further embodiment the detector detects the electron beam intensity by measuring an intensity of electrons incident on a beam stop, i.e. by measuring a current supplied by the beam stop. The beam stop may comprise a beam stop having an aperture traversed by the electron beam, and in particular the anode for generating the extraction field.

According to a further embodiment, the source surface of the cathode body comprises barium oxide, or is made of barium oxide, since this type of material has a particularly low work function $\phi_W$. According to an advantageous embodiment, the barium oxide is applied to a cathode body made of e.g. tungsten.

According to a further embodiment of the invention the photon beam is used for a further purpose apart from its function in view of adjusting the electron beam intensity in the normal mode of operation. In an annealing mode of operation, the photon beam is directed to the source surface for annealing the source surface and the portion of the cathode body providing the source surface. In the normal mode of operation changes in a configuration of the source surface may occur, such as deposition of ions of a residual gas in a vacuum chamber in which the electron beam source is disposed. Such changes may be reversed by annealing the source surface by increasing the intensity of the photon beam such that the temperature of the source surface in the annealing mode of operation exceeds the temperature of the source surface in the normal mode of operation by more than about 100 K, preferably more than about 200 K, and in particular more than about 300 K or about 500 K.

According to a further embodiment the electron source is used in an electron optical apparatus such as an electron microscope and an electron lithography apparatus.

BRIEF DESCRIPTION OF THE DRAWINGS

Embodiments of the invention are illustrated below with reference to the drawings.

DETAILED DESCRIPTION OF A SPECIFIC EMBODIMENT

Figure 1:
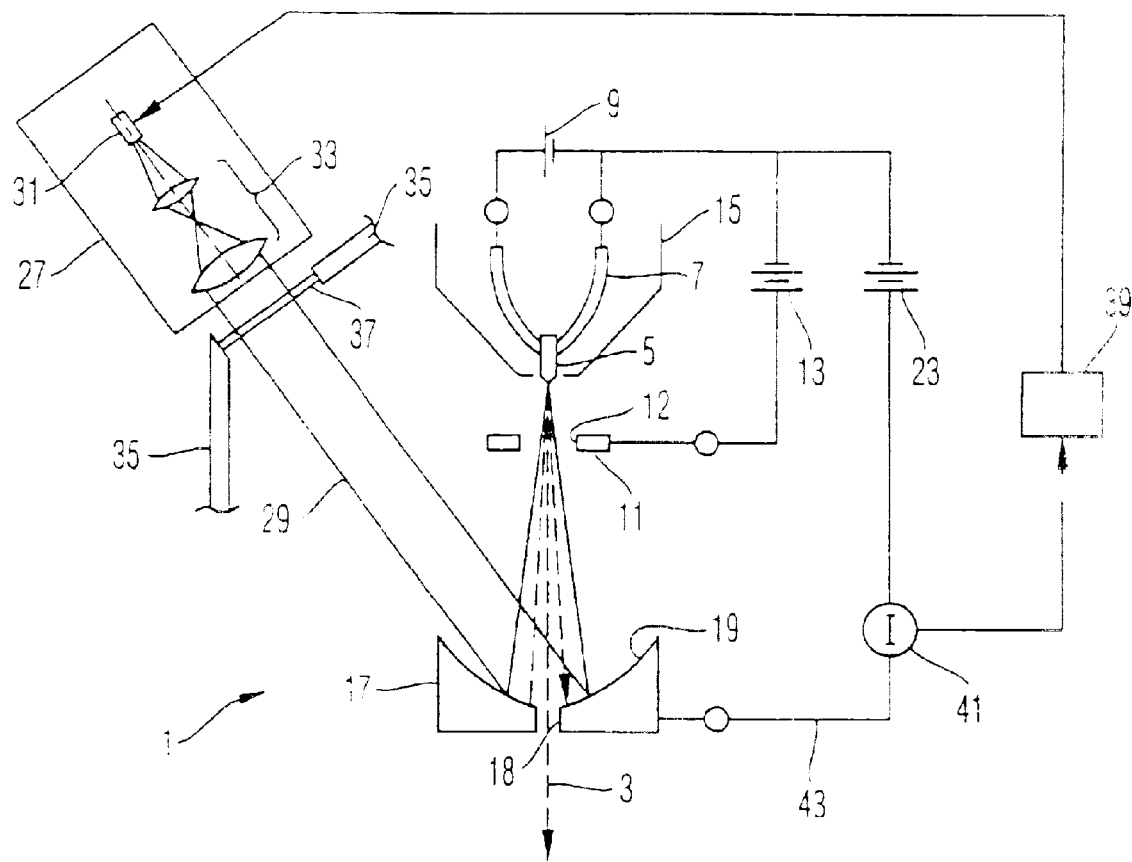
FIG. 1 shows an electron beam source according to an embodiment of the invention, and FIG. 2 an electron beam source according to a further embodiment of the invention and mounted in an electron optical apparatus according to the invention.

An electron beam source 1 shown in FIG. 1 is used for generating an electron beam 3 of a predetermined kinetic energy. The electron beam source 1 comprises a thermally heated cathode body 5 mounted on a V-shaped heating wire 7 at a tip of the V-shape. The heating wire 7 is supplied with a heating current provided by a current source 9. The cathode body 5 is of a tip shape at its end oriented in a direction of emission of the electron beam 5. The tip end of the cathode body 5 has a diameter of about 1 µm at its base and provides the source surface of the cathode body 5, i.e. that portion of the surface from which the electrons forming the electron beam 3 emanate.

The cathode body 5 is made of tungsten and the surface thereof, and in particular the source surface, is covered with a layer of barium oxide such that a work function of the source surface is substantially lower than the work function of tungsten itself. Depending on the method of preparation of the source surface, the work function $\phi_w$ is about 1.5 eV to 2.5 eV. The barium oxide coating of the source surface may be manufactured according to a method as it is disclosed in U.S. Pat. No. 5,763,880 for materials other than barium oxide.

However, barium oxide is not stable under atmosphere such that a preparation of the source surface is performed under vacuum conditions. For instance, plural windings of a barium wire may be provided on the cathode body as a barium reservoir, and the tungsten body may be heated under vacuum. Thereafter oxygen is supplied to the vacuum atmosphere to oxidize the barium reservoir which will spread over the surface of the cathode body.

It is possible to manufacture and prepare the source surface outside of the vacuum casing of the electron beam source and to use a separate vacuum casing for transportation of the cathode body to the electron beam source. The source body may be transferred into the vacuum casing of the electron beam source through a suitable vacuum-airlock mechanism. It is further possible to prepare the source surface inside the vacuum casing of the electron beam source by mounting the cathode body provided with the barium reservoir on heating wire 7 and by heating the cathode body in the vacuum atmosphere of the electron beam source wherein oxygen supplied through a suitable supply (not shown in FIG. 1) positioned close to the cathode body. In the normal mode of operation the vacuum in the region of the cathode body is of the order of about $10^{-8}$ mbar.

An anode beam stop 11 is disposed at a distance from the source surface for generating an electric extraction field between the source surface and anode beam stop 11 with a high voltage source 13. The anode beam stop 11 has an aperture 12 allowing the electron beam to pass there through. The cathode body 5 and the heating wire 7 are surrounded by a suppressor electrode 15 supplied by a voltage source (not shown in FIG. 1) with a suitable voltage for shaping the extraction field between the source surface and the anode beam stop 11 such that the electrons emanating from the source surface are guided through opening 12 provided in anode beam stop 11 and focused to form electron beam 3.

Downstream of anode beam stop 11 the electron beam 3 passes through a further aperture beam stop 17 having an aperture 18 therein. The aperture beam stop 11 is made of metal and has a parabolic surface 19 facing towards the source surface. Parabolic surface 19 is shaped and positioned with respect to the tip of cathode body 5 such that a distance between the source surface and the bottom of the parabola is two times the radius of curvature of the parabolic surface at the bottom of the parabola.

A high voltage source 23 is provided for biasing the aperture beam stop 17 with respect to cathode body 5 such that the electrons are accelerated after passing through anode 11.

A photon source 27 generates a collimated photon beam 29 which is directed onto the parabolic mirror 19. The photon source 27 comprises a semiconductor laser diode 31 emitting light of a wavelength of 650 nm as a divergent beam. The divergent beam is collimated by a collimating optics 33 to shape the collimated beam 29. Beam 29 passes through a window 37 provided in a vacuum casing 35 of electron beam source 1. The photon beam 29 is focused onto the source surface by parabolic mirror 19 such that the focused beam passes through aperture 12 in anode 11. The photons of photon beam 29 assist in releasing electrons from the source surface due to a photo effect type mechanism.

An intensity of the photon beam 29 may be adjusted by a controller 39 controlling an electrical power supplied to laser diode 31.

A current meter 41 is provided in a connecting line 43 between high voltage source 23 and aperture electrode 17. The current meter 41 measures an electric current flux between cathode body 5 and aperture electrodes 17. This current is determined by the number of electrons per time unit emitted from the source surface and incident on aperture electrode 17, i.e. those emitted electrons which do not traverse opening 18 of aperture electrode 17. A measuring signal provided by the current meter 41 represents an intensity of the electron beam 3 downstream of opening 18 of aperture electrode 17.

The measuring signal of the current meter 41 is supplied to the controller 39. The controller 39 controls the laser diode 31 of the photon source 27 such that the measuring signal of the current meter 41 is substantially constant in a normal mode of operation of the electron beam source 1. As a consequence, the intensity of the electron beam source 3 is stabilized at a constant level.

The Ohmic heating of the cathode body with the current through heating wire 7 heats the source surface to a temperature of about 1000 K, which is a temperature at which electrons forming an electron beam are already emitted from the source surface, also in a situation where the photon beam 29 is switched off. However, the electron beam intensity emitted with the photon beam switched off is about 80% of the beam current of the electron beam source 1 in the normal mode of operation in which the photon beam 29 is switched on and directed onto the source surface.

The high voltage source 13 generates a voltage of about 5 kV between the cathode body 5 and the anode beam stop 11 such that the electrical extraction field at the source surface is of about $10^6$ V/cm.

When the photon beam 29 is switched off, the thermal heating of the cathode body and the extraction field cooperate in releasing electrons from the source surface as illustrated above with respect to the Schottky effect. Due to the wave mechanical tunneling effect involved there in, the electron beam intensity is strongly dependent on the temperature of the source surface, and already very small changes of operating conditions of the electron beam source 1 may result in substantial changes of the electron beam current. However, such changes of the electron beam current are detected by current meter 41 and transmitted to controller 39 which in turn controls the photon source 27 such that changes of the electron beam intensity due to changing operating conditions are compensated for. The electron beam 3 is stabilized with respect to its beam intensity by photon beam 29. At the same time, the temperature of about 1000 K of the source surface is low, as compared with conventional Schottky emission type beam sources, resulting in a low width (FWHM) of a distribution of kinetic energies of electrons in electron beam 3. The energy width is about 0.3 eV in the illustrated embodiment.

The electron beam source 1 generates the electron beam 3 with a low energy width and a high constancy in time.

The photon source 27 is configured such that the intensity of the photon beam 29 may be increased as compared to the intensity of beam 29 in the normal mode of operation. In such annealing mode of operation, the intensity of the photon beam 29 may be increased such that the photon beam heats the source surface to a temperature of about 1300 K to 1500 K. It is thus possible to anneal the source surface and to evaporate surface contamination thereon in a short time of about 1 ms or shorter. The electric field for extracting the electrons from the source surface and for shaping the electron beam may be switched off during the annealing mode of operation.

In the following further embodiments will be illustrated. Herein, components which correspond in function or structure to components of the embodiment illustrated with reference to FIG. 1 are designated by the same reference numbers, however, supplemented by an additional letter for the purpose of distinction. Reference is made to the entire above description.

Figure 2:
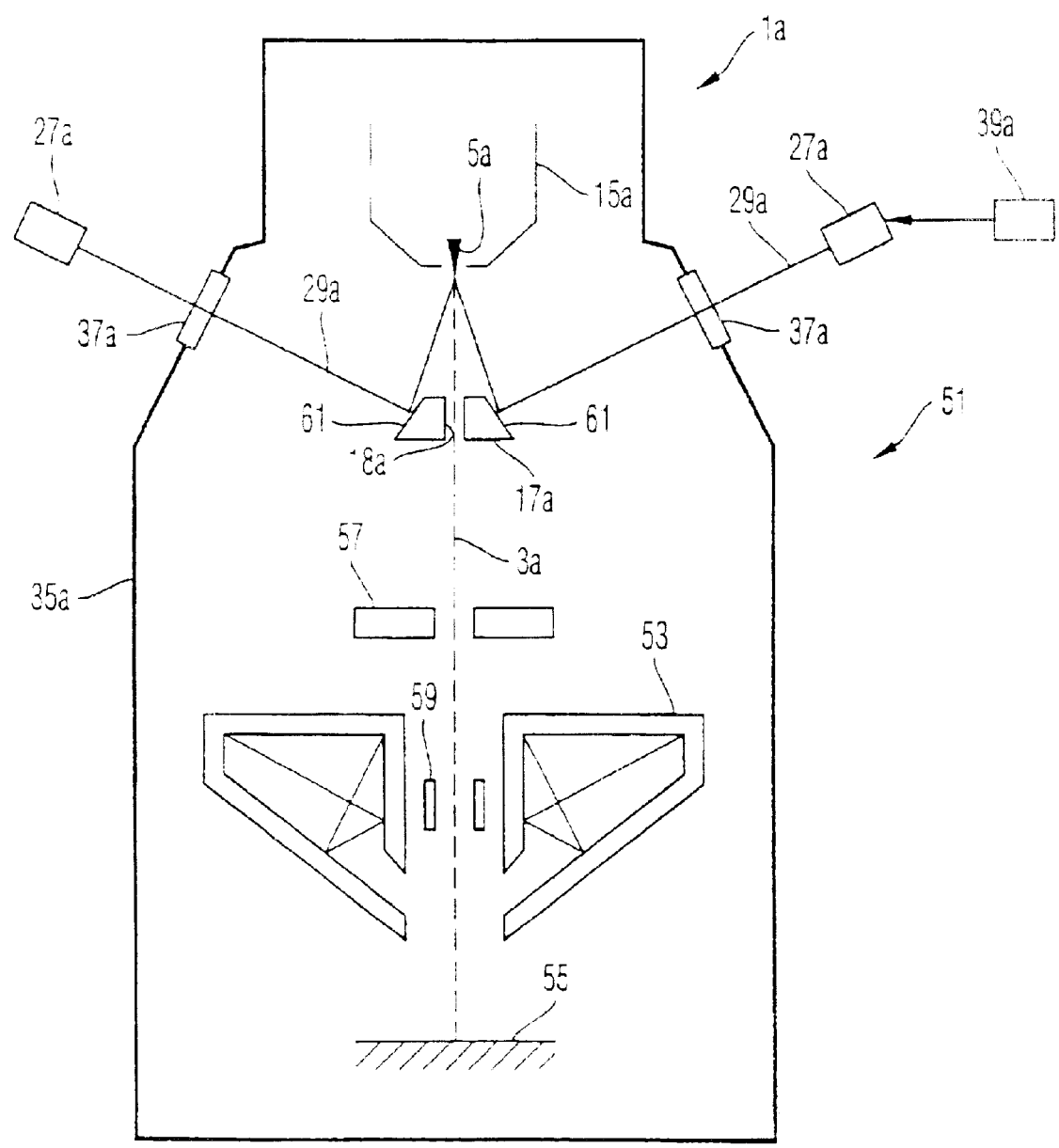

FIG. 2 schematically illustrates an electron microscope 51. The electron microscope 51 comprises an electron beam source 1a for generating an electron beam 3a which is focused by an objective lens 53 onto an object plane 54. Electrons of electron beam 3a will generate secondary electrons emanating from an object disposed in object plane 55. The secondary electrons traverse the objective lens 53 to be incident on an electron detector 57 to be detected thereby. Deflecting coils 59 are positioned in a bore of objective lens 53 to displace a location at which the electron beam 3a is focused on the object plane 54. An electron microscopical image of the object plane 54 is generated by recording the secondary electron intensity detected with detector 57 in dependence of the location of the focus of electron beam 3a on object plane 55.

The electron beam source 1a is of a similar configuration as the electron beam source illustrated with reference to FIG. 1 above. A cathode body 5a disposed in an interior of a suppressor electrode 15a is heated by a heater (not shown in FIG. 2). An anode beam stop 17a is disposed at a distance from cathode body 5a and has a central opening 18a which is traversed by electron beam 3a.

Different from the electron beam source of FIG. 1, the anode beam stop 17a is not of a parabolic shape. Anode beam stop 17a has plural flat mirror surfaces 61, and a laser beam 29a is directed onto each mirror surface 61, wherein the laser beams 29a enter the vacuum casing 35a of electron microscope 51 through windows 37a.

The laser beams 29a are focused such that a focus of each laser beam 29a is formed on the tip of cathode body 5a after reflection from mirror surface 51. The plural laser beams 29a, which may comprise two, three, four or more laser beams generated from laser sources 27 are distributed in a circumferential direction about electron beam 3a. The beams 29a are incident on the source surface such that more than 60% and advantageously more than 80% of the source surface is illuminated with laser light.

Also the electron beam source 1a comprises a controller 39a for controlling the light sources 27a of laser beams 39a to control the intensity of the laser beams 29 in dependence of an electron beam current detected by a current meter not shown in FIG. 2. The control operation is performed such that the electron beam current is substantially constant in time.

In a mode of operation different from the normal mode of operation, with laser beams 29a switched off, the electron beam source 1a generates an electron beam intensity of about 80% of the intensity of the electron beam 3a in the normal mode of operation.

In the embodiment shown in FIG. 1 the anode aperture beam stop 11 is disposed upstream of the further aperture beam stop 17. The aperture beam stop 11 is often referred to as an extracting electrode. It is, however, possible to only provide the anode aperture beam stop 11 if such a configuration is sufficient to form the electron beam. As an alternative to the embodiment shown in FIG. 1 an electron current incident on anode aperture beam stop 11 may be measured to supply a measuring signal to controller 39 for control of the photon beam intensity.

It is also possible to provide a further anode aperture or extracting electrode in between cathode body 5a and anode 17a. Herein, it is possible to provide one single aperture of a sufficient size such that the electron beam and the photon beam may penetrate the aperture. It is, however, also possible to provide a small central aperture for the electron beam 3 passing there through and to provide separate apertures for passing the light beams 29a there through.

For measuring the electron beam current it is also possible to provide further apertures in the electron beam path. It is also possible to measure the beam current incident on the inspected object.

In an alternative embodiment of the apparatus shown in FIG. 2 the apparatus is used as an electron lithography apparatus. In this embodiment the contribution of the heater to the electron emission process is reduced, and the photon beams 29a and the extraction field mainly contribute to the electron emission process for releasing electrons from the source surface. When the laser beams 29a are switched off, a very low electron beam intensity is generated. It is then possible to write a pattern into an electron sensitive resist coating of an object disposed in object plane 54 by deflecting the electron beam 3a using deflection coils 59 and switching the laser beams 29a on and off.

It is often desirable to write grey scale images into the resist rather than writing only binary patterns with electron beams merely switched on and off. It is then necessary to control a total electron beam charge deposited at a particular location based on exposure characteristics of the resist. For obtaining a desired grey level it is necessary to exactly deposit a predetermined electron charge at a particular location. The controller integrates the detected current until the integral exceeds a threshold corresponding to the desired grey value. The controller then energizes the deflector 59 to focus the electron beam onto a next location or pixel. Such process is repeated for each location or pixel of the object plane 54.

In the embodiments illustrated above the photon beam is incident on the source surface from a side of the anode aperture. It is, however, also possible that the photon beam is directed onto the source surface from any other direction, in particular from a direction oriented substantially perpendicular to the direction of the emitted electron beam.

In the above illustrated embodiments the source surface is provided by a barium oxide layer provided on a tungsten tip. As an alternative, it is also possible to provide source surfaces made of oxides or nitrides of other elements, such as yttrium, scandium, vanadium, lanthanum, zirconium, titanium or combinations thereof disposed on suitable cathode bodies.

In the embodiments illustrated above the intensity of the photon beam is adjusted by supplying different electrical power to the light source. It is, however, possible to change the intensity of the electron beam by other suitable means, such as a beam controller, such as a Pockels cell having a polarisator, or a low voltage modulator in the beam path of the photon beam.

Therefore, while the present invention has been shown and described herein in what is believed to be the most practical and preferred embodiments, it is recognized that departures can be made therefrom within the scope of the invention, which is therefore not be limited to the details disclosed herein but is to be accorded the full scope of the claims so as to embrace any and all equivalent methods and apparatus.

What is claimed is:

1. An electron beam source for generating a beam of electrons, the electron beam source comprising:
   a cathode body having a source surface for emission of electrons;
   an anode disposed at a distance from the cathode body, for generating an extraction field for extracting the electrons from the source surface;
   a heater for heating the cathode body;
   a photon source for generating at least one photon beam directed onto the source surface for assisting in the electron emission, wherein the photon source is configured such that an intensity of the at least one photon beam is adjustable;
   a detector for detecting a beam current of the electron beam and for providing a measuring signal representing the electron beam current; and
   a controller configured to control the intensity of the photon beam based on the measuring signal in a normal mode of operation of the electron beam source,
   wherein, in a mode of operation different from the normal mode of operation and in which the photon beam is not directed onto the source surface, the electron beam current is higher than about 0.3 times the electron beam current in the normal mode of operation.

2. The electron beam source according to claim 1, wherein, in the different mode of operation in which the photon beam is not directed onto the source surface, the electron beam current is higher than about 0.65 times the electron beam current in the normal mode of operation.

3. The electron beam source according to claim 1, wherein, in the different mode of operation in which the photon beam is not directed onto the source surface, the electron beam current is higher than about 0.80 times the electron beam current in the normal mode of operation.

4. The electron beam source according to claim 1, wherein a maximum intensity of the photon beam in the normal mode of operation is limited such that a temperature of the source surface is below about 1300 K in a mode of operation different from the normal mode of operation and in which no other energy is supplied to the cathode body apart from the photon beam.

5. The electron beam source according to claim 1, wherein a maximum intensity of the photon beam in the normal mode of operation is limited such that a temperature of the source surface is below about 1100 K in a mode of operation different from the normal mode of operation and in which no other energy is supplied to the cathode body apart from the photon beam.

6. The electron beam source according to claim 1, wherein the heater comprises an electrical resistance heater.

7. The electron beam source according to claim 1, wherein the controller is configured to control the photon source such that the electron beam current is substantially constant in time in the normal mode of operation.

8. The electron beam source according to claim 1, wherein a mirror deflecting the at least one photon beam is disposed in a beam path of the at least one photon beam between the photon source and the source surface.

9. The electron beam source according to claim 8, wherein the mirror is provided on an aperture beam stop traversed by the electron beam.

10. The electron beam source according to claim 8, wherein the mirror is of a substantially parabolic shape.

11. The electron beam source according to claim 1, wherein plural photon beams are directed onto the source surface.

12. The electron beam source according to claim 1, wherein the detector is configured to detect an intensity of emitted electrons incident on an aperture beam stop traversed by the electron beam.

13. The electron beam source according to one of claim 1, wherein the source surface of the cathode body is made of a material comprising barium oxide.

14. The electron beam source according to claim 1, wherein, in the normal mode of operation, the source surface is at a working temperature, and wherein the photon source is configured to increase the intensity of the photon beam in an annealing mode of operation different from the normal mode of operation such that the temperature of the source surface is more than about 100 K above the working temperature.

15. The electron beam source according to claim 1, wherein, in the normal mode of operation, the source surface is at a working temperature, and wherein the photon source is configured to increase the intensity of the photon beam in an annealing mode of operation different from the normal mode of operation such that the temperature of the source surface is more than about 200 K above the working temperature.

16. The electron beam source according to claim 1, wherein, in the normal mode of operation, the source surface is at a working temperature, and wherein the photon source is configured to increase the intensity of the photon beam in an annealing mode of operation different from the normal mode of operation such that the temperature of the source surface is more than about 300 K above the working temperature.

17. An electron optical apparatus comprising:
an objective lens for focusing a beam of electrons at a location in an object plane of the objective lens, and an electron beam source for generating the beam of electrons, the electron beam source comprising:
a cathode body having a source surface for emission of electrons;
an anode disposed at a distance from the cathode body, for generating an extraction field for extracting the electrons from the source surface;
a heater for heating the cathode body;
a photon source for generating at least one photon beam directed onto the source surface for assisting in the electron emission, wherein the photon source is
configured such that an intensity of the at least one photon beam is adjustable;
a detector for detecting a beam current of the electron beam and for providing a measuring signal representing the electron beam current; and
a controller configured to control the intensity of the photon beam based on the measuring signal in a normal mode of operation of the electron beam source,
wherein, in a mode of operation different from the normal mode of operation and in which the photon beam is not directed onto the source surface, the electron beam current is higher than about 0.3 times the electron beam current in the normal mode of operation.

18. The electron optical apparatus according to claim 17, further comprising a detector for detecting secondary electrons emanating from the object.

19. The electron optical apparatus according to claim 17, further comprising a deflector for scanning the location at which the electron beam is focused in the object plane.

20. A method for operating an electron beam source comprising a cathode body having a source surface, wherein the method comprises operating the electron beam source in a normal mode of operation, wherein, in the normal mode of operation:
the cathode body is heated;
the source surface is illuminated with a photon beam of a adjustable intensity;
electrons are extracted from the source surface, and the extracted electrons are shaped to form the electron beam;
a quantity representing an intensity of the electron beam is measured; and
an intensity of the photon beam is controlled based on the measured quantity;
and wherein the cathode body is heated in the normal mode of operation such that in a mode of operation different from the normal mode of operation, in which the source surface is not illuminated with the photon beam and in which the cathode body is heated in the same manner as in the normal mode of operation, the intensity of the electron beam is higher than about 0.3 times the intensity of the electron beam in the normal mode of operation.

21. The method according to claim 20, further comprising operating the electron beam source in an annealing mode of operation, wherein, in the annealing mode of operation, the intensity of the photon beam is increased with respect to the intensity of the photon beam in the normal mode of operation during a duration such that the temperature of the source surface is higher than the temperature of the source surface in the normal mode of operation by more than about 100 K.

* * * * *

UNITED STATES PATENT AND TRADEMARK OFFICE
CERTIFICATE OF CORRECTION

PATENT NO. : 6,828,565 B2 Page 1 of 1
DATED : December 7, 2004
INVENTOR(S) : Michael Steigerwald It is certified that error appears in the above-identified patent and that said Letters Patent is hereby corrected as shown below:

Title page,
Item [54], Title, correct to read:
-- ELECTRON BEAM SOURCE, ELECTRON OPTICAL APPARATUS USING SUCH BEAM SOURCE AND METHOD OF OPERATING AN ELECTRON BEAM SOURCE --.
Item [73], Assignee, should be corrected to read:
-- Carl Zeiss NTS GmbH (DE) --.

Signed and Sealed this

Thirteenth Day of September, 2005

JON W. DUDAS
*Director of the United States Patent and Trademark Office*